United States Patent
Chang et al.

(10) Patent No.: US 9,466,384 B1
(45) Date of Patent: Oct. 11, 2016

(54) MEMORY DEVICE AND ASSOCIATED ERASE METHOD

(71) Applicant: MACRONIX INTERNATIONAL CO., LTD., Hsinchu (TW)

(72) Inventors: Yu-Ming Chang, Pingtung County (TW); Hsiang-Pang Li, Zhubei (TW); Hung-Sheng Chang, Hsin-chu (TW); Chih-Chang Hsieh, Hsinchu (TW); Kuo-Pin Chang, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/684,561

(22) Filed: Apr. 13, 2015

(51) Int. Cl.
*G11C 11/34* (2006.01)
*G11C 16/16* (2006.01)
*G11C 16/18* (2006.01)
*G11C 16/14* (2006.01)

(52) U.S. Cl.
CPC .............. *G11C 16/16* (2013.01); *G11C 16/14* (2013.01); *G11C 16/18* (2013.01)

(58) Field of Classification Search
CPC ................................ G11C 16/14; G11C 16/18
USPC ................................ 365/185.29, 185.3, 218
See application file for complete search history.

(56) References Cited

U.S. PATENT DOCUMENTS

| 6,335,882 | B1 * | 1/2002 | Saeki | G11C 11/5635 365/185.02 |
| 2010/0110796 | A1 * | 5/2010 | Park | G11C 16/344 365/185.19 |
| 2014/0247667 | A1 * | 9/2014 | Dutta | G11C 16/14 365/185.22 |

* cited by examiner

*Primary Examiner* — Han Yang
(74) *Attorney, Agent, or Firm* — McClure, Qualey & Rodack, LLP

(57) ABSTRACT

A memory device and an erase method for the memory device are provided. The memory device includes plural blocks and a controller. The plural blocks include at least one first block and at least one second block. The erase method is controlled by the controller and includes the following steps. A first stage erase operation and a second stage erase operation are sequentially performed on the at least one first block in a first time interval and a second time interval. The first stage erase operation and the second stage erase operation are sequentially performed on the at least one second block in the second time interval and a third time interval.

20 Claims, 13 Drawing Sheets

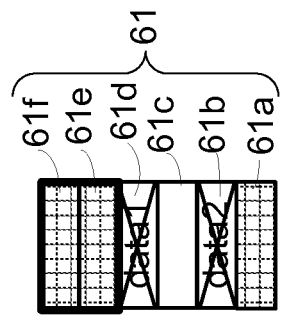
FIG. 13C
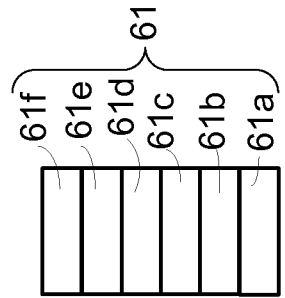
FIG. 13F
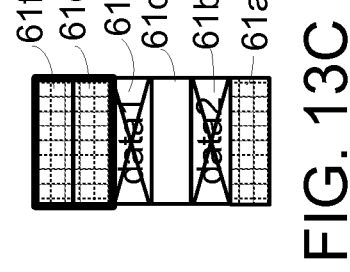
FIG. 13B
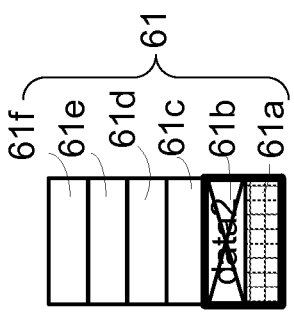
FIG. 13E
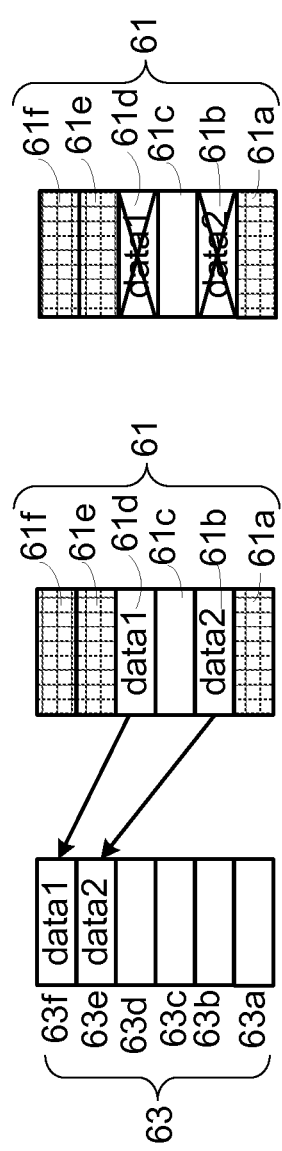
FIG. 13A
FIG. 13D

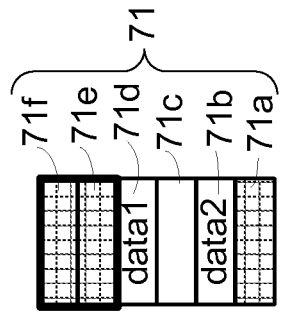
FIG. 14A
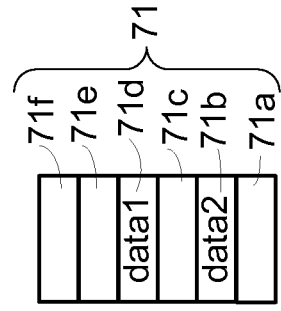
FIG. 14B
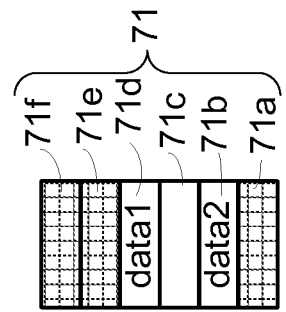
FIG. 14C
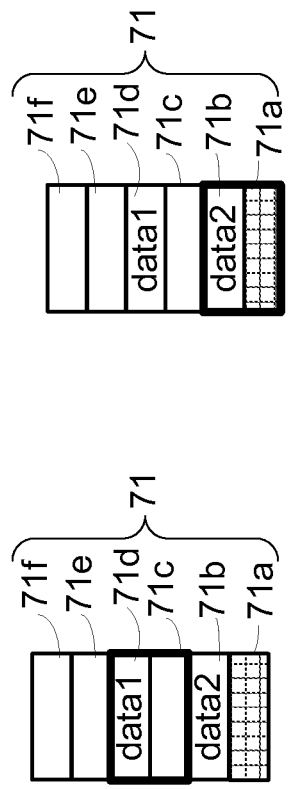
FIG. 14D
FIG. 14E

MEMORY DEVICE AND ASSOCIATED ERASE METHOD

FIELD OF THE INVENTION

The present invention relates to a memory device and an erase method thereof, and more particularly to a memory device in a pipeline configuration and an erase method thereof.

BACKGROUND OF THE INVENTION

A flash memory is one of the widely used non-volatile memories. Generally, a flash memory chip includes plural memory cells.

FIG. 1 is a schematic cross-sectional view illustrating a memory cell of a conventional non-volatile memory. Generally, charges may be stored in the region between a control gate C and a substrate 13. The operations of the flash memory include a write operation, a read operation and an erase operation. While the write operation or the erase operation is performed, the amount of the charges stored in the region between the control gate C and a substrate 13 may be subjected to a change.

Generally, a threshold voltage ($V_{th}$) of the transistor is determined according to the amount of the stored charges. During the write operation, the threshold voltage is changed by applying a positive voltage to the control gate, and the magnitude of the threshold voltage is changed according to the written data. Whereas, during the erase operation, the threshold voltage is changed by applying a negative voltage to the cell. During a read operation, a voltage is applied to the region between the drain terminal D and the source terminal S. When another voltage applied to control gate reaches the threshold voltage, the cell is turned on. According to the magnitude of the threshold voltage, the storing state of the cell can be realized.

FIG. 2 schematically illustrates the change of the threshold voltage distribution curve for the flash memory during the erase operation. In the threshold voltage distribution curve, a greater number of the cells have a median threshold voltage. For example, after a data is written into a single-level cell (SLC) flash memory, the median threshold voltage is V0. For reusing the cells, the threshold voltage ($V_{th}$) should be erased to the left of an erase verification voltage $V_{erase}$ by applying a negative voltage to the cells.

Generally, the flash memory includes plural blocks. Each block includes plural pages. The erases operation of the flash memory is performed on blocks. On the other hand, the write operation or the read operation of the flash memory is performed on pages. Typically, the erase operation of the flash memory takes a longer time period than that required by read and write operations. Generally, it takes about several microseconds (µs) to perform the read operation and the write operation of the flash memory, and it takes about several milliseconds (ms) to perform the erase operation. The erase operation for erasing the block of the flash memory is lengthy and consumes a great deal of electric power.

When a controlling circuit issues an erase command to a block, a negative voltage is applied to the cells of the block and the controlling circuit further judges whether the threshold voltages of all cells of the block are lower than the erase verification voltage $V_{erase}$. If the threshold voltages of all cells of the block are lower than the erase verification voltage $V_{erase}$, the verifying condition is satisfied. If the verifying condition is not satisfied, the controlling circuit control the corresponding voltages to erase a block again until the threshold voltages of all cells of the block are lower than the erase verification voltage $V_{erase}$. After the erase operation is completed, the median threshold voltage of the threshold voltage distribution curve is referred as a target voltage $V_{target}$. Moreover, the time interval from the time point of issuing the erase command to the completion of the erase operation is referred as an erase time period $T_{erase}$.

FIG. 3 schematically illustrates the change of the operating state of a block of the flash memory according to an erase command. Before the erase operation is performed, the block 15a is referred as a used block. After the erase operation is completed, the block 15b is referred as a free block. As mentioned above, all cells of the block need to be erased and verified. Consequently, as the number of pages contained in the block increases or the number of cells contained in each page increases, the number of cells contained in the block increases. Correspondingly, the erase time period $T_{erase}$ corresponding to the erase command is longer.

Since the erase time period $T_{erase}$ is longer, the performance of the flash memory is gradually deteriorated. Moreover, the flash memory may be erroneously judged as a malfunctioned flash memory by a control chip. If the message about the verifying result is not successfully received by the control chip after the erase command has been issued for a predetermined time period, the control chip will consider the erase command as ineffective. As the number of cells contained in the block increases, the erase time period $T_{erase}$ is correspondingly increased. Under this circumstance, the possibility of erroneously judging the flash memory as the malfunctioned flash memory by the control chip will increase. Therefore, there is a need of providing a memory device and an erase method for performing an erase operation so as to quickly generate free blocks.

SUMMARY OF THE INVENTION

An embodiment of the present invention provides an erase method for a memory device with a plurality of blocks. A first stage erase operation and a second stage erase operation are sequentially performed on at least one first block of the plurality of blocks in a first time interval and a second time interval. The first stage erase operation and the second stage erase operation are sequentially performed on at least one second block of the plurality of blocks in the second time interval and a third time interval.

Another embodiment of the present invention provides a memory device including a plurality of blocks and a controller. The controller is electrically connected with the plurality of blocks. The controller sequentially performs a first stage erase operation and a second stage erase operation on at least one first block of the plurality of blocks in a first time interval and a second time interval. The controller sequentially performs the first stage erase operation and the second stage erase operation on at least one second block of the plurality of blocks in the second time interval and a third time interval.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 13A~13F schematically illustrates the process of copying out data and obtaining a free block according to the multiple subblock erase commands;

FIGS. 14A~14E schematically illustrates the process of only erasing the invalid pages according to the multiple subblock erase commands.

DETAILED DESCRIPTION OF PREFERRED EMBODIMENTS

As mentioned above, the time period of performing the erase operation on the block is very long. For solving the above drawbacks of the conventional technologies, the present invention provides a memory device in a pipeline configuration and an erase method for simultaneously erasing plural blocks. In this context, the terms "blocks" or "memory blocks" denote blocks of a flash memory. Moreover, the blocks marked by grid meshes denote the victim blocks which are selected through a selection algorithm and intended to be erased.

A flash storage device or a solid state drive (SSD) may include plural flash memory chips or a single flash memory chip. Each of the plural flash memory chips may have some blocks required to be erased, or the single flash memory may have some blocks required to be erased. Moreover, the flash storage device or the solid state drive is equipped with a flash storage processor (FSP) for managing a lot of NAND flash dies. In firmware design, the manufacturer of the solid state drive may retain an additional storage space for over-provisioning (OP). During the garbage collection and the wear-leveling operation, the additional space of the over-provisioning has some benefits. In accordance with the present invention, the over-provisioning technique is employed to provide buffering space in the pipeline erase stages while maintaining the available storage capacity.

Figure 1:
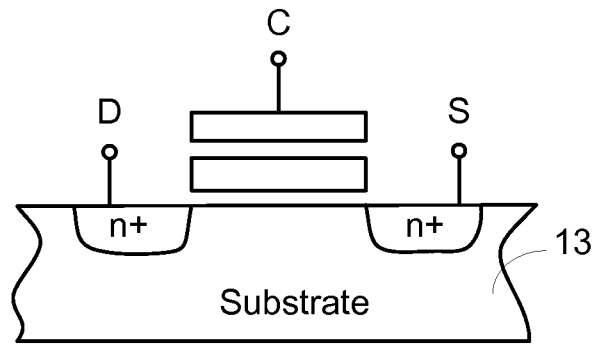
FIG. 1 is a schematic cross-sectional view illustrating a memory cell of a conventional non-volatile memory.
Figure 2:
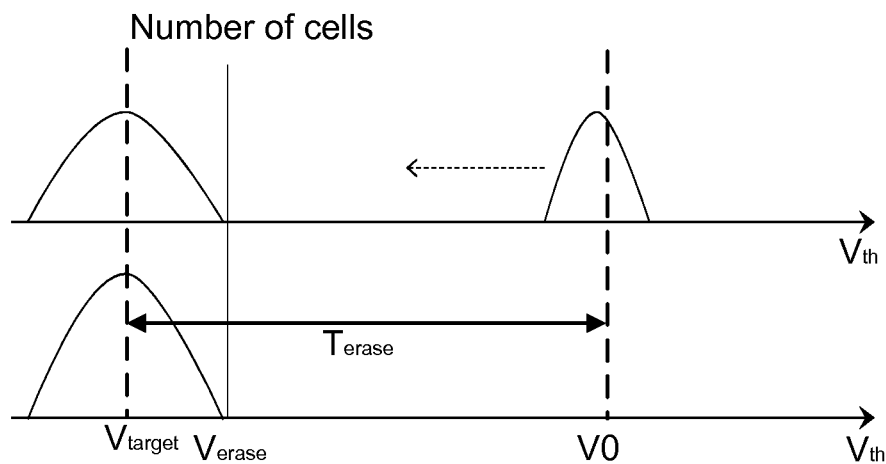
FIG. 2 schematically illustrates the change of the threshold voltage distribution curve for the flash memory during the erase operation.
Figure 3:
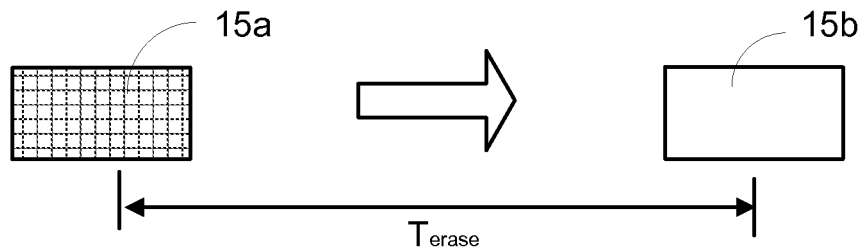
FIG. 3 schematically illustrates the change of the operating state of a block of the flash memory according to an erase command.
Figure 4A:
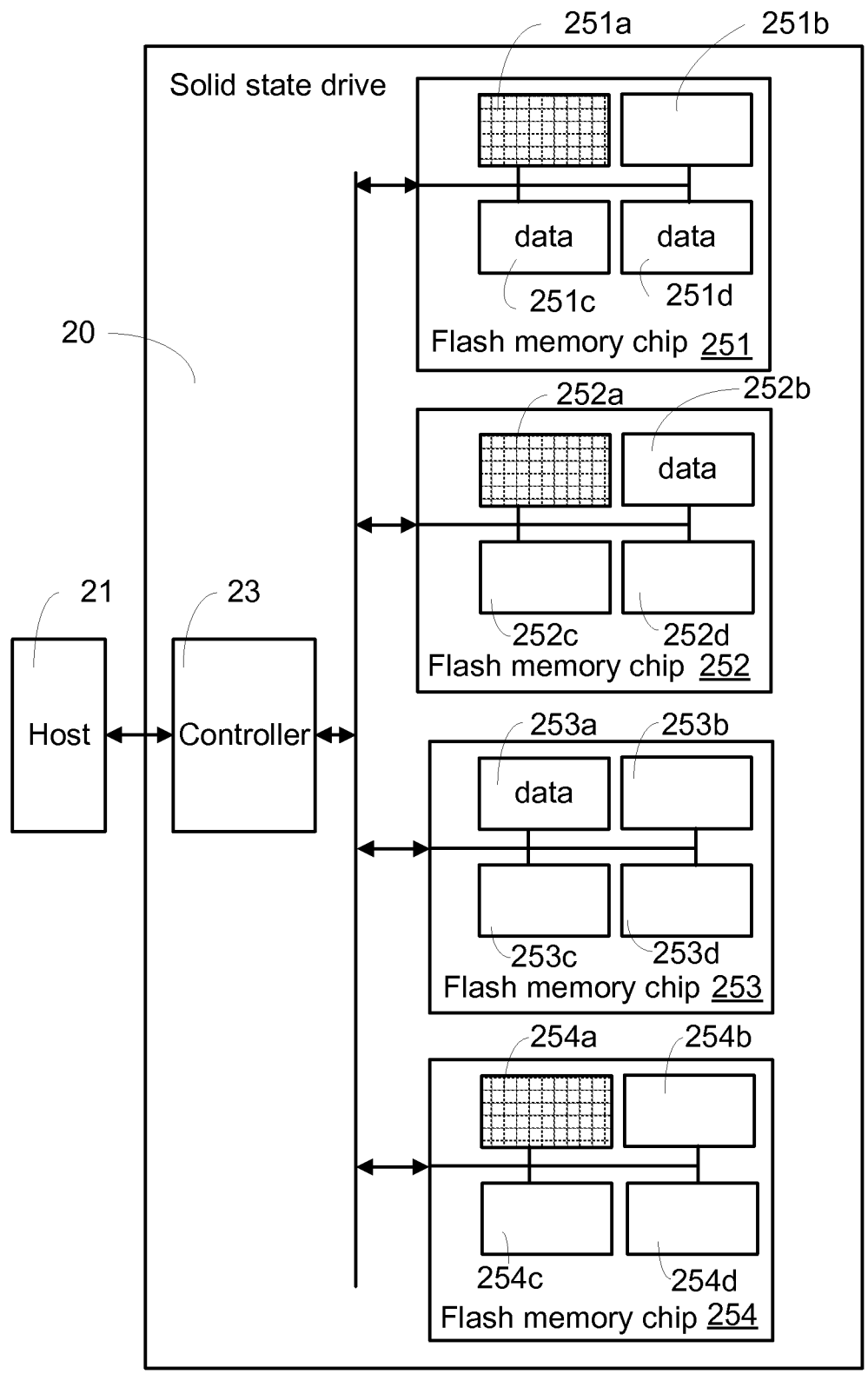
FIG. 4A schematically illustrates a solid state drive with plural flash memory chips.

FIG. 4A schematically illustrates a solid state drive with plural flash memory chips. The solid state drive 20 is in communication with a host 21 through an external bus. For example, the host 21 is a central processing unit (CPU) of a notebook computer. Moreover, plural flash memory chips are controlled by a controller 23 within the solid state drive 20. For clarification and brevity, only four flash memory chips 251, 252, 253 and 254 are shown in the drawing. Moreover, it is assumed that each flash memory chip includes four blocks. For example, the flash memory chip 251 includes four blocks 251a, 251b, 251c and 251d; the flash memory chip 252 includes four blocks 252a, 252b, 252c and 252d; the flash memory chip 253 includes four blocks 253a, 253b, 253c and 253d; and the flash memory chip 254 includes four blocks 254a, 254b, 254c and 254d. The controller 23 can realize the operating states of all blocks of the flash memory chips 251, 252, 253 and 254. For example, the blocks 251a, 252a and 254a are victim blocks to be erased; the blocks 251b, 252c, 252d, 253b, 253c, 253d, 254b, 254c and 254d are free blocks; and the blocks 251c, 251d, 252b and 253a store valid data.

Figure 4B:
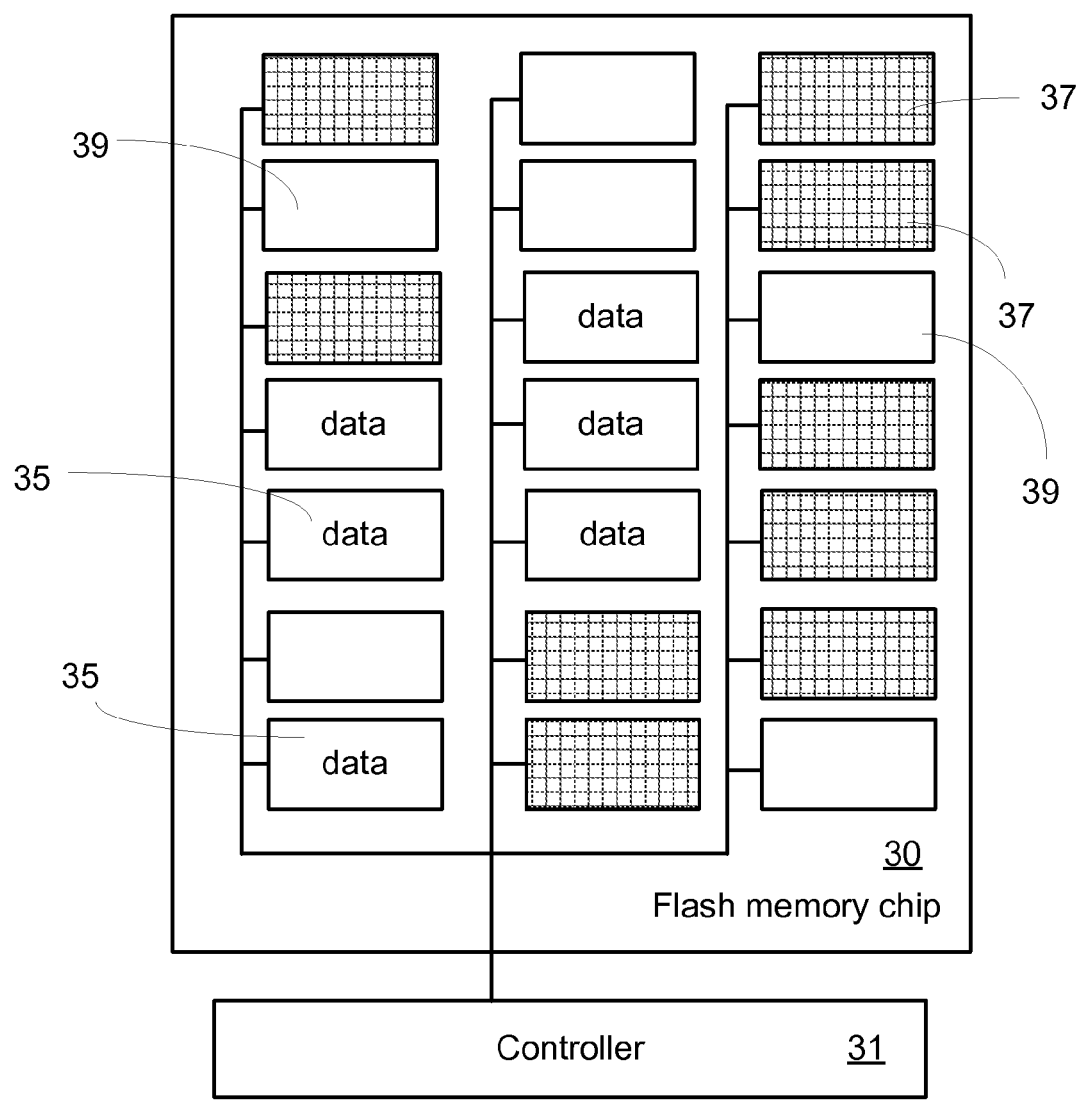
FIG. 4B schematically illustrates a single flash memory chip with plural blocks.

FIG. 4B schematically illustrates a single flash memory chip with plural blocks. The flash memory chip 30 includes plural blocks, and a controller 31 can realize the operating states of all blocks. In FIG. 4B, the blocks 37 marked by grid meshes are victim blocks to be erased, the blocks 35 labelled by the word "data" store valid data, and the blocks 39 are free blocks.

Moreover, various selection algorithms for selecting the blocks to be erased can be applied to the victim block selections of the present invention. These selection algorithms include for example the least recently used (LRU) selection algorithm, the greedy selection algorithm, the young block-based selection algorithm, the least valid page-based selection algorithm, and so on.

The present invention provides an erase method for performing pipeline stage erase operations. In each pipeline stage, plural victim blocks are simultaneously erased according to multiple partial erase commands or multiple subblock erase commands. It is noted that the actual locations of the victim blocks to be erased in the pipeline stage are not restricted. That is, the victim blocks may be included in the same flash memory chip (see FIG. 4B) or included in different flash memory chips (see FIG. 4A). In some cases, some victim blocks are included in a flash memory chip, and the other victim blocks are included in other flash memory chips.

In case that the memory device contains plural victim blocks, the erase method of the present invention can simultaneously perform partial erase operations or subblock erase operations on M blocks in M pipeline stages according to multiple partial erase commands or multiple subblock erase commands, wherein M is a positive integer. The following examples will be illustrated by referring to M=3. In case that the erase time period for erasing a memory block according to an erase command is $T_{erase}$, one block is erased to store data at the time interval of $T_{erase}/M$. After a first block is erased, an additional free block is provided at the time interval of $T_{erase}/M$. As the value of M increases, the average time period of erasing the block is shortened.

As mentioned above, the erase time period for erasing a memory block according to an erase command is $T_{erase}$. The whole erase cycle of each block is divided into M pipeline stages. According to one of the pipeline erase commands, the erase time interval of performing multiple pipeline erase operations in each pipeline stage is approximately equal to $T_{erase}/M$. After the erase time period $T_{erase}$, a first block is erased. Then, one free block is provided at the time interval of $T_{erase}/M$. In accordance with the present invention, the pipeline erase commands for executing the pipeline stage erase operations include partial erase commands or subblock erase commands.

Figure 5:
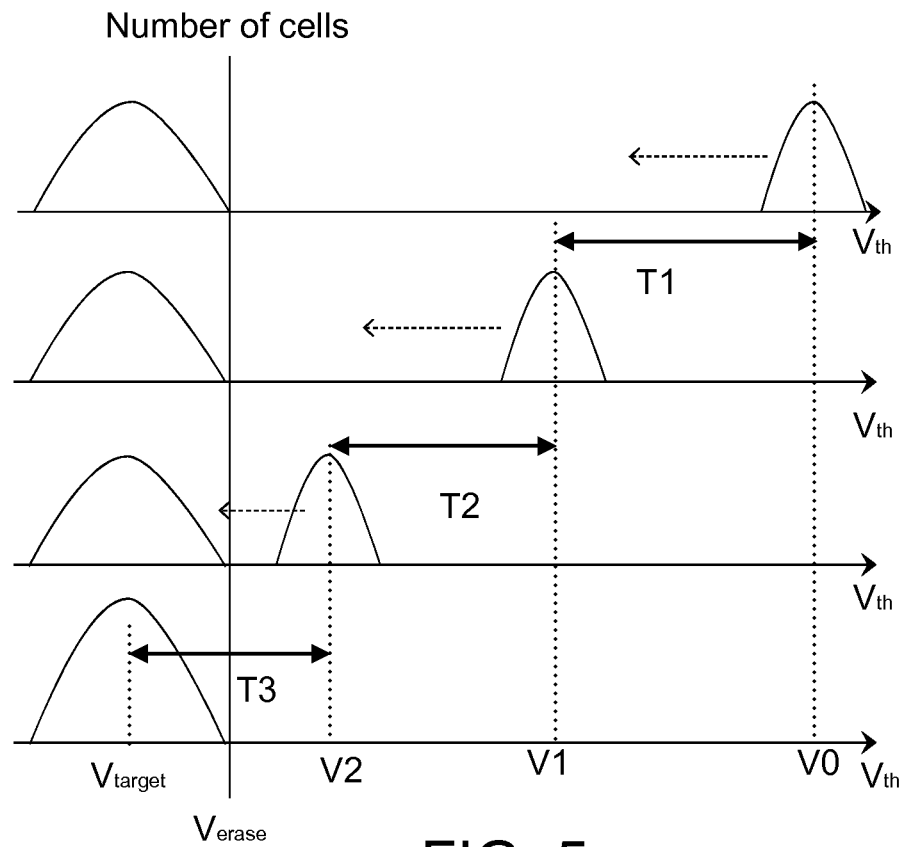
FIG. 5 schematically illustrates the changes of the threshold voltage distribution curve for a block according to three partial erase commands.

FIG. 5 schematically illustrates the changes of the threshold voltage distribution curve for a block according to three partial erase commands. In this embodiment, the whole erase cycle is divided into three pipeline stages (that is, M=3). According to a first partial erase command, the median threshold voltage of the cells of the block is reduced from the original voltage level V0 to a first voltage level V1. The time period for executing the first partial erase command is equal to a first stage erase time interval T1. According to a second partial erase command, the median threshold voltage of the cells of the block is reduced from the first voltage level V1 to a second voltage level V2. The time period for executing the second partial erase command is equal to a second stage erase time interval T2. According to a third partial erase command, the median threshold voltage of the cells of the block is reduced from the second voltage level V2 to the target voltage $V_{target}$. The time period for executing the third partial erase command is equal to a third stage erase time interval T3. Moreover, the first stage erase time interval T1, the second stage erase time interval T2 and the third stage erase time interval T3 are equal. Furthermore, a voltage difference between the original voltage level V0 and the first voltage level V1 is greater than a voltage difference between the first voltage level V1 and the second voltage level V2; and the voltage difference between the first voltage level V1 and the second voltage level V2 is greater than a voltage difference between the second voltage level V2 and the third voltage level V3.

Figure 6:
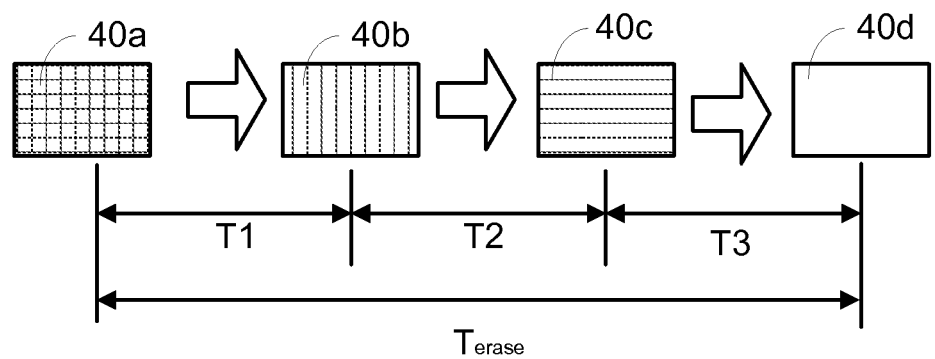
FIG. 6 schematically illustrates the changes of the operating states of a block according to three partial erase commands.

FIG. 6 schematically illustrates the changes of the operating states of a block according to three partial erase commands. After a partial erase operation is performed on the victim block 40a according to the first partial erase command, the median threshold voltage of the cells of the block is reduced from the original voltage level V0 to the first voltage level V1. The block 40b corresponding to the first voltage level V1 is marked by vertical lines.

After a partial erase operation is performed on the block 40b according to the second partial erase command, the median threshold voltage of the cells of the block is reduced from the first voltage level V1 to a second voltage level V2. The block 40c corresponding to the second voltage level V2 is marked by horizontal lines.

After a partial erase operation is performed on the block 40c according to the third partial erase command, the median threshold voltage of the cells of the block is reduced from the second voltage level V2 to the target voltage $V_{target}$. The block 40d corresponding to the target voltage $V_{target}$ is a free block.

In case that the time period of erasing a block is $T_{erase}$, the sum of the first stage erase time interval T1, the second stage erase time interval T2 and the third stage erase time interval T3 is equal to or slightly larger than $T_{erase}$.

Figure 7:
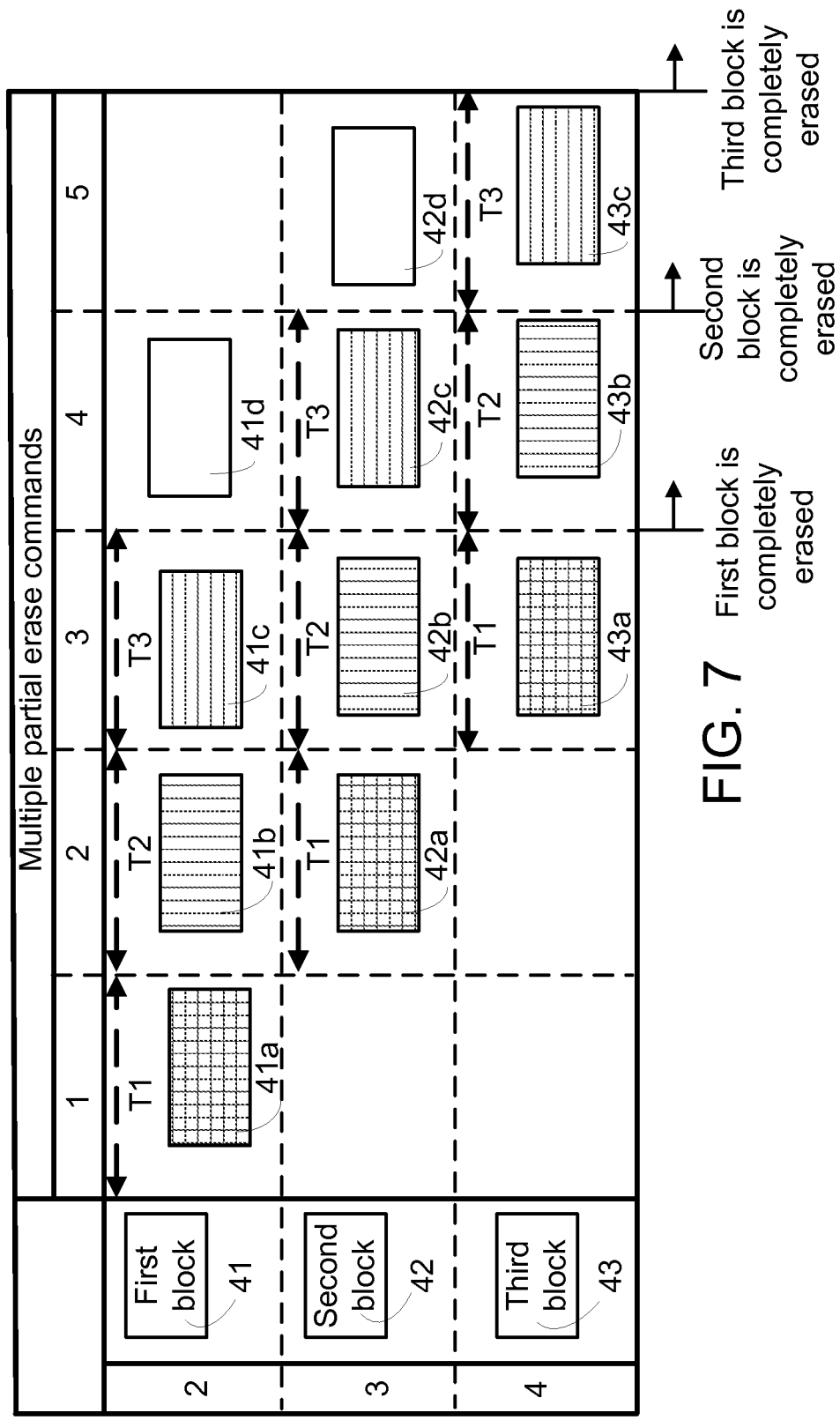
FIG. 7 schematically illustrates the changes of the operating states of three blocks according to multiple partial erase commands.

FIG. 7 schematically illustrates the changes of the operating states of three blocks according to multiple partial erase commands. In this embodiment, multiple partial erase commands are simultaneously issued to plural blocks. Similarly, the whole erase cycle of each block is divided into three pipeline stages (that is, M=3). That is, the erase operation of each block is completed after three partial erase operations are performed. The first row of FIG. 7 indicates the sequence of issuing the multiple partial erase commands from the controller to the memory chip(s).

The second row of FIG. 7 indicates the changes of the operating states of a first block 41. According to a first one of the multiple partial erase commands, the median threshold voltage of the cells of the first block 41 is reduced from the original voltage level V0 to the first voltage level V1 in the first stage erase time interval T1. According to a second one of the multiple partial erase commands, the median threshold voltage of the cells of the first block 41 is reduced from the first voltage level V1 to a second voltage level V2 in the second stage erase time interval T2. According to a third one of the multiple partial erase commands, the median threshold voltage of the cells of the first block 41 is reduced from the second voltage level V2 to the target voltage $V_{target}$ in the third stage erase time interval T3. After the third one of the multiple partial erase commands is executed, the first block 41 is completely erased. In other words, at the time point of starting executing the fourth one of the multiple partial erase commands, the first block 41 can be used to store data.

The third row of FIG. 7 indicates the changes of the operating states of a second block 42. According to the second one of the multiple partial erase commands, the median threshold voltage of the cells of the second block 42 is reduced from the original voltage level V0 to the first voltage level V1 in the first stage erase time interval T1. According to the third one of the multiple partial erase commands, the median threshold voltage of the cells of the second block 42 is reduced from the first voltage level V1 to a second voltage level V2 in the second stage erase time interval T2. According to the fourth one of the multiple partial erase commands, the median threshold voltage of the cells of the second block 42 is reduced from the second voltage level V2 to the target voltage $V_{target}$ in the third stage erase time interval T3. After the fourth one of the multiple partial erase commands is executed, the second block 42 is completely erased. In other words, at the time point of starting executing the fifth one of the multiple partial erase commands, the second block 42 can be used to store data.

The fourth row of FIG. 7 indicates the changes of the operating states of a third block 43. According to the third one of the multiple partial erase commands, the median threshold voltage of the cells of the third block 43 is reduced from the original voltage level V0 to the first voltage level V1 in the first stage erase time interval T1. According to the fourth one of the multiple partial erase commands, the median threshold voltage of the cells of the third block 43 is reduced from the first voltage level V1 to a second voltage level V2 in the second stage erase time interval T2. According to a fifth one of the multiple partial erase commands, the median threshold voltage of the cells of the third block 43 is reduced from the second voltage level V2 to the target voltage $V_{target}$ in the third stage erase time interval T3. After the fifth one of the multiple partial erase commands is executed, the third block 43 is completely erased. After fifth one of the multiple partial erase commands is completely executed, the third block 43 can be used to store data.

From the above discussions, after the third one of the multiple partial erase commands is completely executed, one block is erased to store data at every stage erase time interval. Since every stage erase time interval is approximately equal to $(1/3) \times T_{erase}$, the overall erase speed is largely increased.

Figure 8:
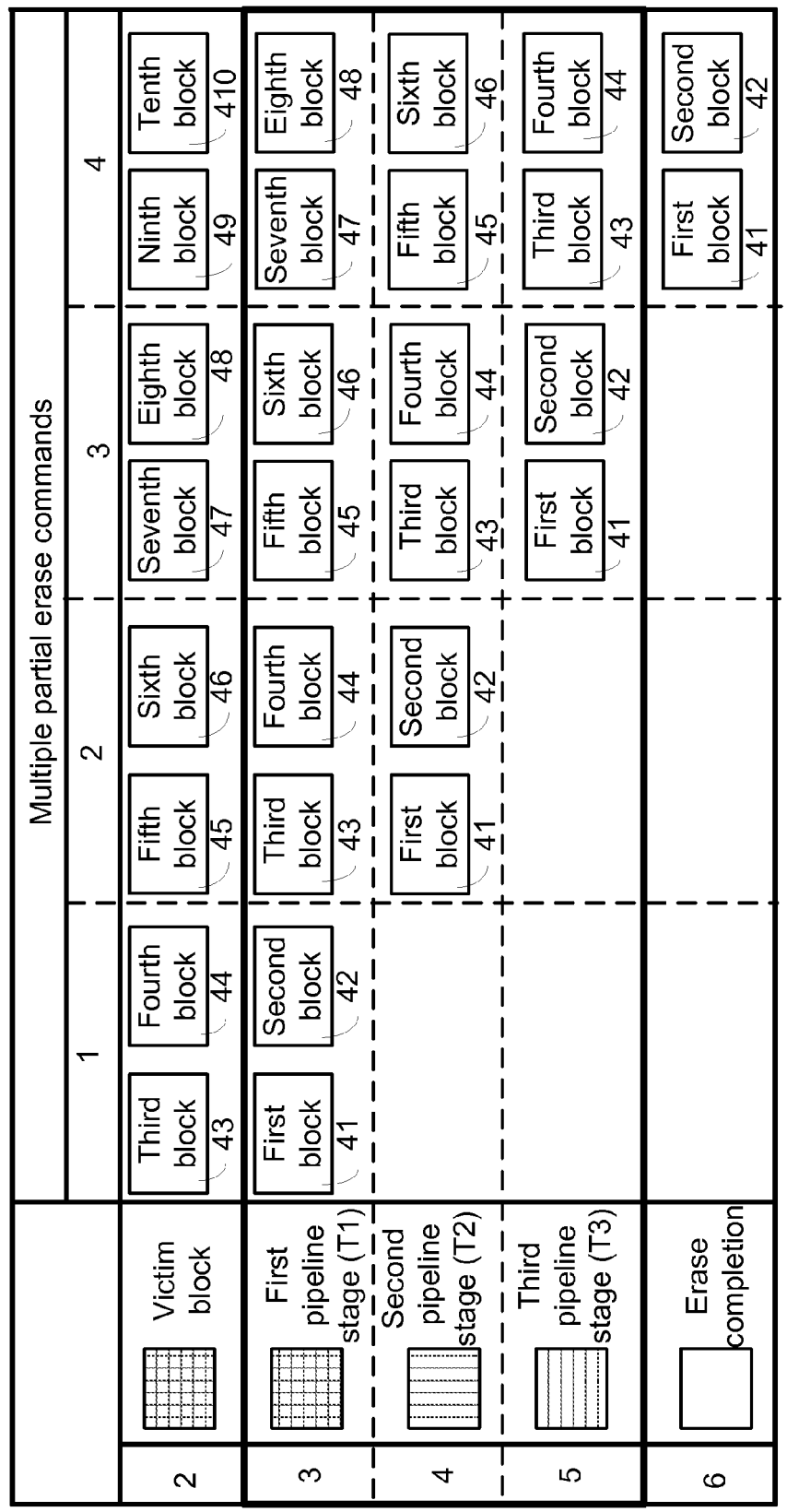
FIG. 8 schematically illustrates the sequences of performing partial erase operations on plural blocks according to multiple partial erase commands.

Moreover, according to each of the multiple partial erase commands, the partial erase operations may be performed on plural blocks in the same stage erase time interval. FIG. 8 schematically illustrates the sequences of performing partial erase operations on plural blocks according to multiple partial erase commands. In this embodiment, multiple partial erase commands are simultaneously issued to plural blocks. Similarly, the whole erase cycle of each block is divided into three pipeline stages (that is, M=3).

The first row of FIG. 8 indicates the sequence of issuing the multiple partial erase commands from the controller to the memory chip(s). The second row of FIG. 8 indicates the victim blocks that are selected by the selection algorithm. The other rows of FIG. 8 indicate the operating states of corresponding blocks.

According to a first one of the multiple partial erase commands, a first partial erase operation is performed on a first block 41 and a second block 42 (that is, in the first pipeline stage). Consequently, the median threshold voltages of the cells of the first block 41 and the second block 42 are reduced from the original voltage level V0 to the first voltage level V1 in the first stage erase time interval T1. Meanwhile, a third block 43 and a fourth block 44 are selected as the victim blocks.

According to a second one of the multiple partial erase commands, a second partial erase operation is performed on the first block 41 and the second block 42 (that is, in the second pipeline stage). Consequently, the median threshold voltages of the cells of the first block 41 and the second block 42 are reduced from the first voltage level V1 to a second voltage level V2 in the second stage erase time interval T2. Moreover, according to the second one of the multiple partial erase commands, a first partial erase operation is performed on the third block 43 and the fourth block 44 (that is, in the first pipeline stage). Consequently, the median threshold voltages of the cells of the third block 43 and the fourth block 44 are reduced from the original voltage level V0 to the first voltage level V1 in the first stage erase time interval T1. Meanwhile, a fifth block 45 and a sixth block 46 are selected as the victim blocks.

According to a third one of the multiple partial erase commands, a third partial erase operation is performed on the first block 41 and the second block 42 (that is, in the third pipeline stage). Consequently, the median threshold voltages of the cells of the first block 41 and the second block 42 are reduced from the second voltage level V2 to the target voltage $V_{target}$ in the third stage erase time interval T3. Moreover, according to the third one of the multiple partial erase commands, a second partial erase operation is performed on the third block 43 and the fourth block 44 (that is, in the second pipeline stage). Consequently, the median threshold voltages of the cells of the third block 43 and the fourth block 44 are reduced from the first voltage level V1 to a second voltage level V2 in the second stage erase time interval T2. Moreover, according to the third one of the multiple partial erase commands, a first partial erase operation is performed on the fifth block 45 and the sixth block 46 (that is, in the first pipeline stage). Consequently, the median threshold voltages of the cells of the fifth block 45 and the sixth block 46 are reduced from the original voltage level V0 to the first voltage level V1 in the first stage erase time interval T1. Meanwhile, a seventh block 47 and an eighth block 48 are selected as the victim blocks.

After the third one of the multiple partial erase commands is executed, the first block 41 and the second block 42 are completely erased. According to a fourth one of the multiple partial erase commands, a third partial erase operation is performed on the third block 43 and the fourth block 44 (that is, in the third pipeline stage). Consequently, the median threshold voltages of the cells of the third block 43 and the fourth block 44 are reduced from the second voltage level V2 to the target voltage $V_{target}$ in the third stage erase time interval T3. Moreover, according to the fourth one of the multiple partial erase commands, a second partial erase operation is performed on the fifth block 45 and the sixth block 46 (that is, in the second pipeline stage). Consequently, the median threshold voltages of the cells of the fifth block 45 and the sixth block 46 are reduced from the first voltage level V1 to a second voltage level V2 in the second stage erase time interval T2. Moreover, according to the fourth one of the multiple partial erase commands, a first partial erase operation is performed on the seventh block 47 and the eighth block 48 (that is, in the first pipeline stage). Consequently, the median threshold voltages of the cells of the seventh block 47 and the eighth block 48 are reduced from the original voltage level V0 to the first voltage level V1 in the first stage erase time interval T1. Meanwhile, a ninth block 49 and a tenth block 410 are selected as the victim blocks.

As shown in FIGS. 7 and 8, if the number of blocks undergoing the partial erase operation in each pipeline stage increases, the overall erase speed is increased. For example, as shown in FIG. 7, after the third one of the multiple partial erase commands is executed, only the first block 41 is completely erased. Whereas, as shown in FIG. 8, after the third one of the multiple partial erase commands is executed, the first block 41 and the second block 42 are completely erased. In particular, if the whole erase cycle of each block is divided into M pipeline stages and N blocks undergo the partial erase operation in each pipeline stage, the overall erase speed is increased. That is, the time period of erasing a block is reduced to $T_{erase}/(M \times N)$.

In some situations, the threshold voltages of the cells of these blocks are reduced more easily. Consequently, some blocks have been erased before the anticipated pipeline stage is finished. That is, the median threshold voltages of the cells of these blocks are reduced to the target voltage $V_{target}$ before the anticipated pipeline stage is finished. For facilitating management, these blocks are provided as the free blocks after the final pipeline stage is finished.

Figure 9:
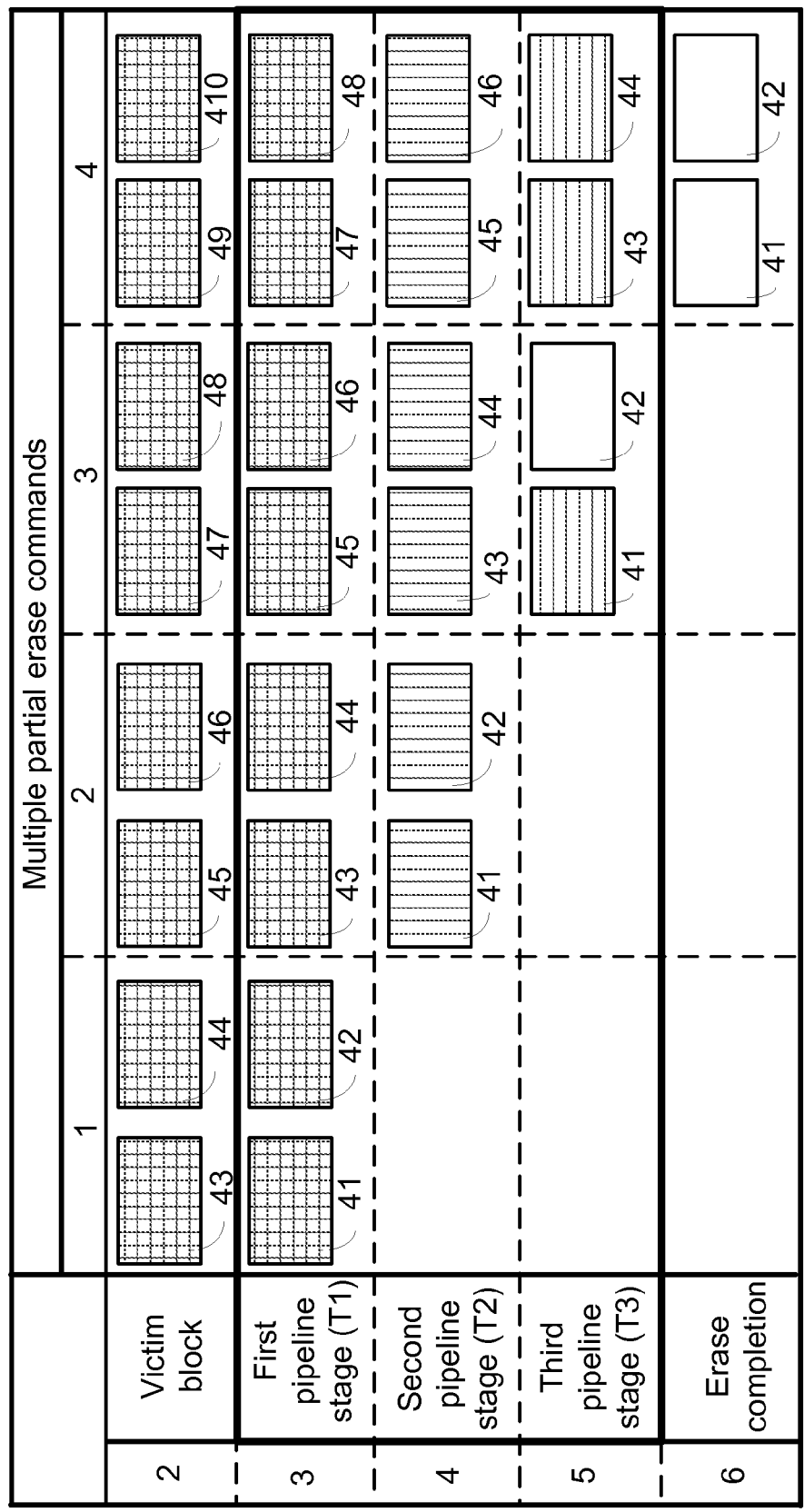
FIG. 9 schematically illustrates the sequences of performing partial erase operations on plural blocks according to multiple partial erase command, in which some blocks have been erased before the anticipated pipeline stage is finished.

FIG. 9 schematically illustrates the sequences of performing partial erase operations on plural blocks according to multiple partial erase command, in which some blocks have been erased before the anticipated pipeline stage is finished. In comparison with FIG. 9, the operating state of the second block 42 after the second pipeline stage is distinguished. That is, after the second pipeline stage, the second block 42 is completely erased. For facilitating management, the controller still processes the second block 42 in the next pipeline stage. That is, the controller still issues the third one of the multiple partial erase commands to the second block 42.

Generally, according to an erase command, an erase circuit (not shown) provides a proper voltage to the selected block. Since the second block 42 is completely erased before the anticipated pipeline stage is finished, the erase circuit may be specially programmed to deal with this situation. For example, according to the third one of the multiple partial erase commands, the third partial erase operation is still performed on the second block 42. Alternatively, according to the third one of the multiple partial erase commands, the erase circuit stops performing the third partial erase operation on the second block 42. Consequently, the partial erase operation is performed on the same number of blocks in each pipeline stage, and N free blocks (for example, N=2) are provided after the one of the multiple partial erase commands is executed.

Furthermore, the present invention further includes an erase method by performing subblock erase operations. For example, each block contains plural pages (for example, O pages). The O pages are grouped into M groups (or say, subblocks). The pages in the same group are not required to be adjacent. According to a subblock erase command, O/M pages in the same group are erased by the erase circuit. According to the subblock erase command, the median threshold voltage of the cells of the O/M pages is directly reduced from the original voltage level V0 to the target voltage $V_{target}$.

Figure 10:
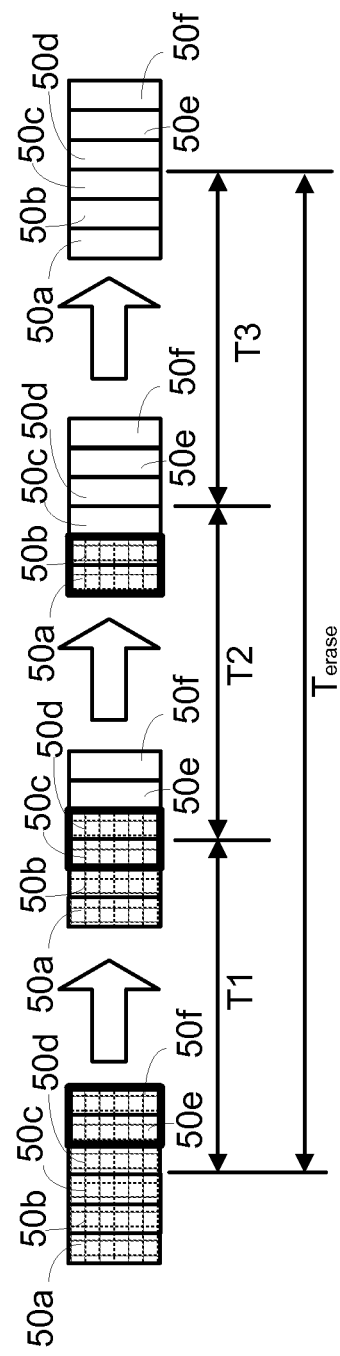
FIG. 10 schematically illustrates the changes of the operating states of a block according to three subblock erase commands.

FIG. 10 schematically illustrates the changes of the operating states of a block according to three subblock erase commands. It is assumed that the block contains six pages 50a, 50b, 50c, 50d, 50e and 50f (that is, O=6). Moreover, the six pages are grouped into three groups (that is, M=3). That is, each group contains two pages. In this embodiment, two pages are simultaneously erased according to the subblock erase command.

Initially, the six pages 50a, 50b, 50c, 50d, 50e and 50f of the block are victim pages to be erased. According to a first subblock erase command, the pages 50e and 50f belong to the first group are erased in a first stage erase time interval T1. Then, according to a second subblock erase command, the pages 50c and 50d belong to the second group are erased in a second stage erase time interval T2. Then, according to a third subblock erase command, the pages 50a and 50b belong to the third group are erased in a third stage erase time interval T3. While the concepts of the subblock erase operation as shown in FIG. 10 are applied to the memory device in the pipeline configuration, the overall erase speed is enhanced.

Figure 11:
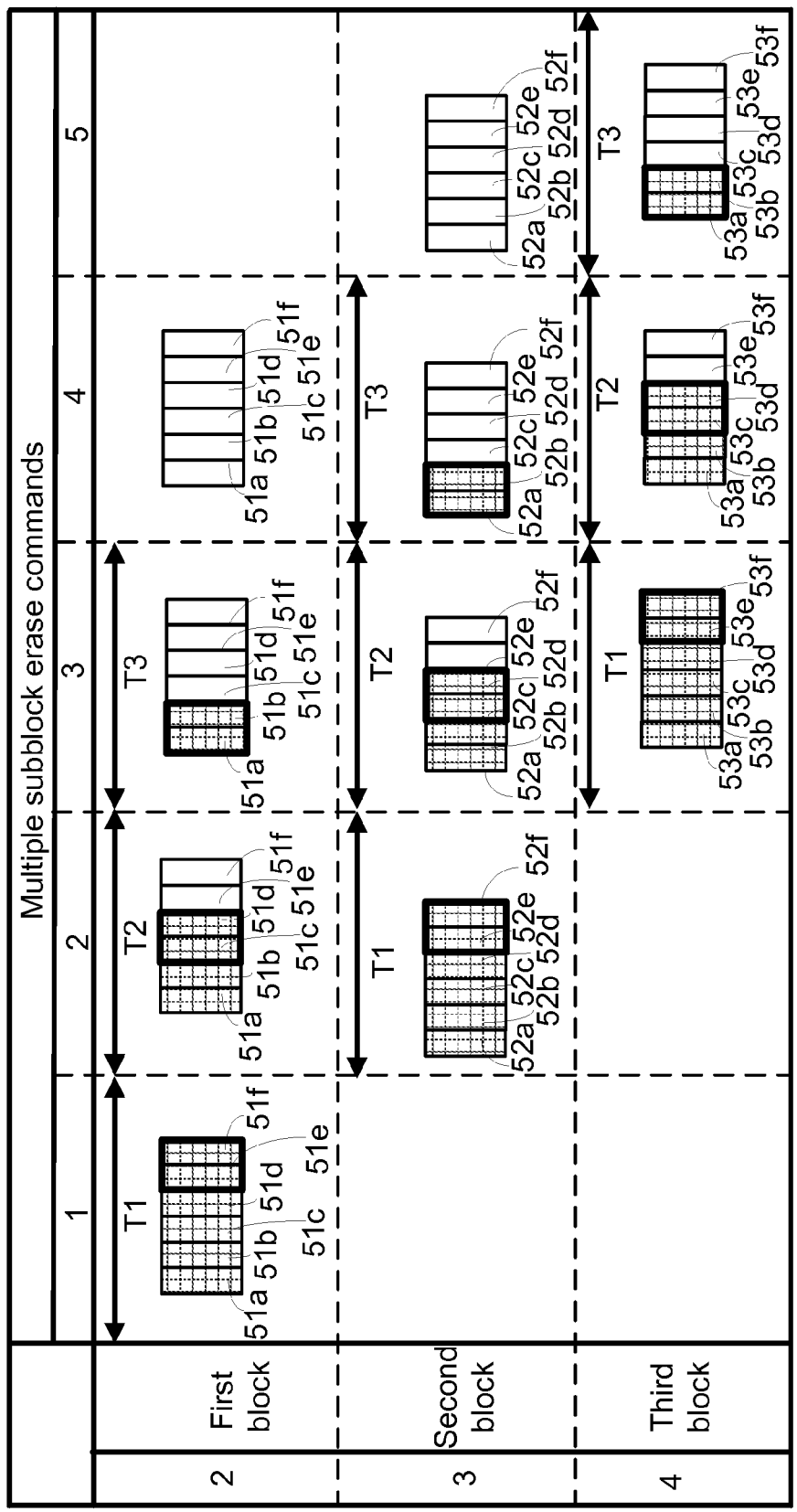
FIG. 11 schematically illustrates the changes of the operating states of three blocks according to multiple subblock erase commands.

FIG. 11 schematically illustrates the changes of the operating states of three blocks according to multiple subblock erase commands. In this embodiment, the whole erase cycle of each block is divided into three pipeline stages (that is, M=3). That is, the erase operation of each block is complete after three subblock erase operations are performed. The first row of FIG. 11 indicates the sequence of issuing the multiple subblock erase commands from the controller to the memory chip(s).

The second row of FIG. 11 indicates the changes of the operating states of a first block. According to a first one of the multiple subblock erase commands, the first group of pages 51e and 51f in the first block are erased by the erase circuit in the first stage erase time interval T1 (that is, in the first pipeline stage). According to a second one of the multiple subblock erase commands, the second group of pages 51c and 51d in the first block are erased by the erase circuit in the second stage erase time interval T2 (that is, in the second pipeline stage). According to a third one of the multiple subblock erase commands, the third group of pages 51a and 51b in the first block are erased by the erase circuit in the third stage erase time interval T3 (that is, in the third pipeline stage). After the third one of the multiple subblock erase commands is executed, the first block is completely erased. In other words, at the time point of starting executing the fourth one of the multiple subblock erase commands, the first block can be used to store data.

The third row of FIG. 11 indicates the changes of the operating states of a second block. According to the second one of the multiple subblock erase commands, the first group of pages 52e and 52f in the second block are erased by the erase circuit in the first stage erase time interval T1 (that is, in the first pipeline stage). According to the third one of the multiple subblock erase commands, the second group of pages 52c and 52d in the second block are erased by the erase circuit in the second stage erase time interval T2 (that is, in the second pipeline stage). According to the fourth one of the multiple subblock erase commands, the third group of pages 52a and 52b in the second block are erased by the erase circuit in the third stage erase time interval T3 (that is, in the third pipeline stage). After the fourth one of the multiple subblock erase commands is executed, the second block is completely erased. In other words, at the time point of starting executing the fifth one of the multiple subblock erase commands, the second block can be used to store data.

The fourth row of FIG. 11 indicates the changes of the operating states of a third block 43. According to the third one of the multiple subblock erase commands, the first group of pages 53e and 53f in the third block are erased by the erase circuit in the first stage erase time interval T1 (that is, in the first pipeline stage). According to the fourth one of the multiple subblock erase commands, the second group of pages 53c and 53d in the third block are erased by the erase circuit in the second stage erase time interval T2 (that is, in the second pipeline stage). According to a fifth one of the multiple subblock erase commands, the third group of pages 53a and 53b in the third block are erased by the erase circuit in the third stage erase time interval T3 (that is, in the third pipeline stage). After the fifth one of the multiple subblock erase commands is executed, the third block is completely erased. In other words, at the time point of starting executing the sixth one of the multiple subblock erase commands, the third block can be used to store data. From the above discussions, after the third one of the multiple subblock erase commands is completely executed, one block is erased to store data at every stage erase time interval.

Figure 12:
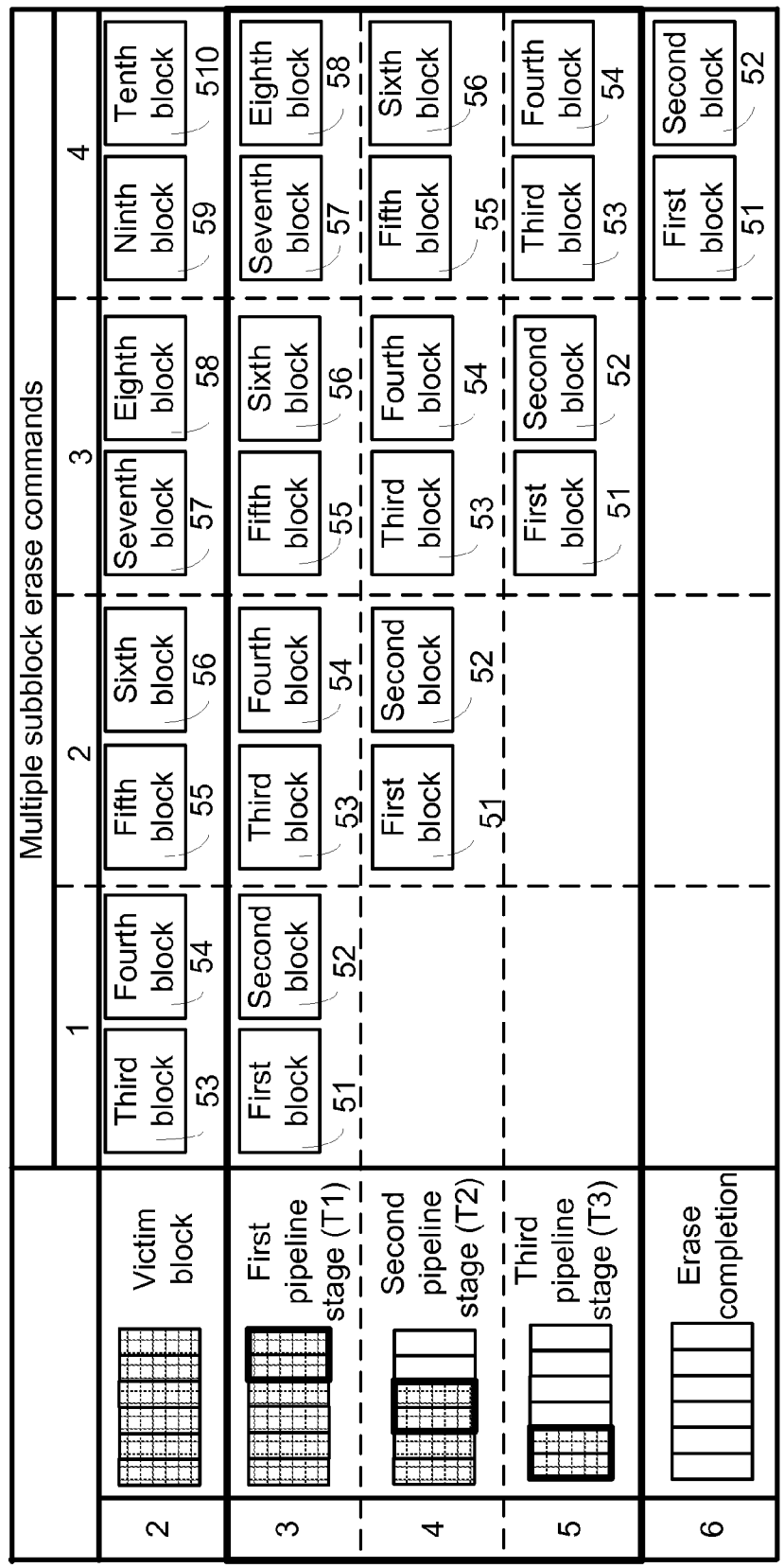
FIG. 12 schematically illustrates the sequences of performing subblock erase operations on plural blocks according to multiple subblock erase commands.

Moreover, according to each of the multiple subblock erase commands, the subblock erase operations may be performed on plural blocks in the same stage erase time interval. FIG. 12 schematically illustrates the sequences of performing subblock erase operations on plural blocks according to multiple subblock erase commands. In this embodiment, multiple subblock erase commands are simultaneously issued to plural blocks. Similarly, the whole erase cycle of each block is divided into three pipeline stages (that is, M=3).

According to a first one of the multiple subblock erase commands, a first subblock erase operation is performed on a first block 51 and a second block 52 (that is, in the first pipeline stage). Consequently, the first group of pages in the first block 51 and the second block 52 are erased by the erase circuit. Meanwhile, a third block 53 and a fourth block 54 are selected as the victim blocks.

Before a second one of the multiple subblock erase commands is executed, the first group of pages in the first block 51 and the second block 52 have been erased. According to the second one of the multiple subblock erase commands, a second subblock erase operation is performed on the first block 51 and the second block 52 (that is, in the second pipeline stage). Consequently, the second group of pages in the first block 51 and the second block 52 are erased by the erase circuit. Moreover, according to the second one of the multiple subblock erase commands, a first subblock erase operation is performed on the third block 53 and the fourth block 54 (that is, in the first pipeline stage). Consequently, the first group of pages in the third block 53 and the fourth block 54 are erased by the erase circuit. Meanwhile, a fifth block 55 and a sixth block 56 are selected as the victim blocks.

Before a third one of the multiple subblock erase commands is executed, the second group of pages in the first block 51 and the second block 52 have been erased and the first group of pages in the third block 53 and the fourth block 54 have been erased. According to the third one of the multiple subblock erase commands, a third subblock erase operation is performed on the first block 51 and the second block 52 (that is, in the third pipeline stage). Consequently, the third group of pages in the first block 51 and the second block 52 are erased by the erase circuit. Moreover, according to the third one of the multiple subblock erase commands, a second subblock erase operation is performed on the third block 53 and the fourth block 54 (that is, in the second pipeline stage). Consequently, the second group of pages in the third block 53 and the fourth block 54 are erased by the erase circuit. Moreover, according to the third one of the multiple subblock erase commands, a first subblock erase operation is performed on the fifth block 55 and the sixth block 56 (that is, in the first pipeline stage). Consequently, the first group of pages in the fifth block 55 and the sixth block 56 are erased by the erase circuit. Meanwhile, a seventh block 57 and an eighth block 58 are selected as the victim blocks.

After the third one of the multiple subblock erase commands is executed, the first block 51 and the second block 52 are completely erased. Before a fourth one of the multiple subblock erase commands is executed, the second group of pages in the third block 53 and the fourth block 54 have been erased and the first group of pages in the fifth block 55 and the sixth block 56 are erased. According to the fourth one of the multiple subblock erase commands, a third subblock erase operation is performed on the third block 53 and the fourth block 54 (that is, in the third pipeline stage), a second subblock erase operation is performed on the fifth block 55 and the sixth block 56 (that is, in the second pipeline stage), and a first subblock erase operation is performed on the seventh block 57 and the eighth block 58 (that is, in the first pipeline stage). Meanwhile, a ninth block 59 and a tenth block 510 are selected as the victim blocks.

As shown in FIGS. 11 and 12, if the number of blocks undergoing the subblock erase operation in each pipeline stage increases, the overall erase speed is increased. For example, as shown in FIG. 11, after the third one of the multiple subblock erase commands is executed, only the first block is completely erased. Whereas, as shown in FIG. 12, after the third one of the multiple subblock erase commands is executed, the first block 51 and the second block 52 are completely erased. In particular, if the whole erase cycle of each block is divided into M pipeline stages and N blocks undergo the subblock erase operation in each pipeline stage, the overall erase speed is increased.

FIGS. 13A~13F schematically the process of copying out data and obtaining a free block according to the multiple subblock erase commands. For example, the block 61 is selected as a victim block. The block 61 contains six pages 61*a*, 61*b*, 61*c*, 61*d*, 61*e* and 61*f*, which are grouped into three groups. The pages 61*a*, 61*e* and 61*f* are invalid pages. The page 61*c* is a free page. The pages 61*b* and 61*d* are valid pages that store data.

Please refer to FIG. 13A. Before the pipeline erase operation is performed, the data in the pages 61*b* and 61*d* are copied out to a backup block 63. Similarly, the block 63 contains six pages 63*a*, 63*b*, 63*c*, 63*d*, 63*e* and 63*f*. The size of each page of the block 63 is equal to the size of each page of the block 61. It is noted that the backup block for storing the data from the victim block is not restricted to the free block.

That is, the valid data "data1" of the page 61*b* and the valid data "data2" of the page 61*d* may be copied out to the block with partial free pages or the block with complete free pages. Moreover, the valid data "data1" of the page 61*b* and the valid data "data2" of the page 61*d* may be copied out to the pages of different blocks. The ways of copying out the valid data "data1" of the page 61*b* and the valid data "data2" of the page 61*d* are well known to those skilled in the art, and are not redundantly described herein.

Please refer to FIG. 13B. Since the valid data "data1" of the page 61*b* and the valid data "data2" of the page 61*d* have been copied out, the pages 61*b* and 61*d* can be erased. Meanwhile, the symbols "data1" and "data2" shown on the pages 61*b* and 61*d* are indicated by check marks.

In FIGS. 13C, 13D and 13E, the pages circumscribed by black frames are victim pages to be erased. As shown in FIG. 13C, a first subblock erase operation is performed on the first group of pages in the block 61 (that is, pages 61*e* and 61*f*). As shown in FIG. 13D, a second subblock erase operation is performed on the second group of pages in the block 61 (that is, pages 61*c* and 61*d*). As shown in FIG. 13E, a third subblock erase operation is performed on the third group of pages in the block 61 (that is, pages 61*a* and 61*b*). After the three subblock erase operations are completed, all of the pages 61*a*, 61*b*, 61*c*, 61*d*, 61*e* and 61*f* of the block 61 are erased (see FIG. 13F). That is, the block 61 is erased as a free block.

It is noted that numerous modifications and alterations may be made while retaining the teachings of the invention. For example, if the controller can control the erase circuit to only erase the invalid pages of the block, the above procedure of copying out the valid pages to other blocks may be omitted.

FIGS. 14A~14E schematically illustrate the process of only erasing the invalid pages according to the multiple subblock erase commands. The constituents of the block 71 are similar to the constituents of the block 61 of FIG. 13A. That is, the block 71 contains six pages 71*a*, 71*b*, 71*c*, 71*d*, 71*e* and 71*f*, which are grouped into three groups. The pages 71*a*, 71*e* and 71*f* are invalid pages. The page 71*c* is a free page. The pages 71*b* and 71*d* are valid pages that store data. In FIGS. 14B, 14C and 14D, the pages circumscribed by black frames are victim pages to be erased.

As shown in FIG. 14B, a first subblock erase operation is performed on the first group of pages in the block 71 (that is, pages 71*e* and 71*f*). Since the pages 71*e* and 71*f* are invalid pages, the pages 71*e* and 71*f* are erased by the erase circuit.

As shown in FIG. 14C, a second subblock erase operation is performed on the second group of pages in the block 71 (that is, pages 71*c* and 71*d*). Since the controller realizes that the page 71*d* stores the valid data "data1", only the page 71*c* is erased by the erase circuit but the page 71*d* is not erased. Alternatively, in another embodiment, the controller realizes that the page 71*c* is a free page and the page 71*d* contains the valid data "data1". Consequently, the erase circuit does not perform the second subblock erase operation on the pages 71*c* and 71*d* of the block 71.

As shown in FIG. 14D, a third subblock erase operation is performed on the third group of pages in the block 71 (that is, pages 71*a* and 71*b*). Since the controller realizes that only the page 71*a* is the invalid page but the page 71*b* stores the valid data "data2", the page 71a is erased by the erase circuit but the page 71b is not erased. After the three subblock erase operations are complete, the result is shown in FIG. 14E.

It is noted that numerous modifications and alterations may be made while retaining the teachings of the invention. For example, if the controller can control the erase circuit to only erase the invalid pages of the block, the number of the subblock erase operations may be reduced. Take the example of the block 71 shown in FIG. 14A as an example. After a first subblock erase operation is performed, the pages 71e and 71f of the block 71 are erased. Moreover, after a second subblock erase operation is performed, only the page 71a is erased. The ways of determining the number and locations of the invalid pages and selecting the group of pages used in the pipeline stages are well known to those skilled in the art, and are not redundantly described herein.

From the above descriptions, the present invention provides a memory device in a pipeline configuration and an erase method for performing pipeline erase operations. Consequently, the speed of generating the free blocks will be enhanced. The pipeline erase operations may be performed according to multiple partial erase commands or multiple subblock erase commands. In particular, the operating states of the block are changed in different pipeline stages according to the multiple partial erase commands or the multiple subblock erase commands. Moreover, in accordance with the present invention, the over-provisioning technique is employed to provide buffering space in the pipeline erase stages while maintaining the available storage capacity.

Figure 15:
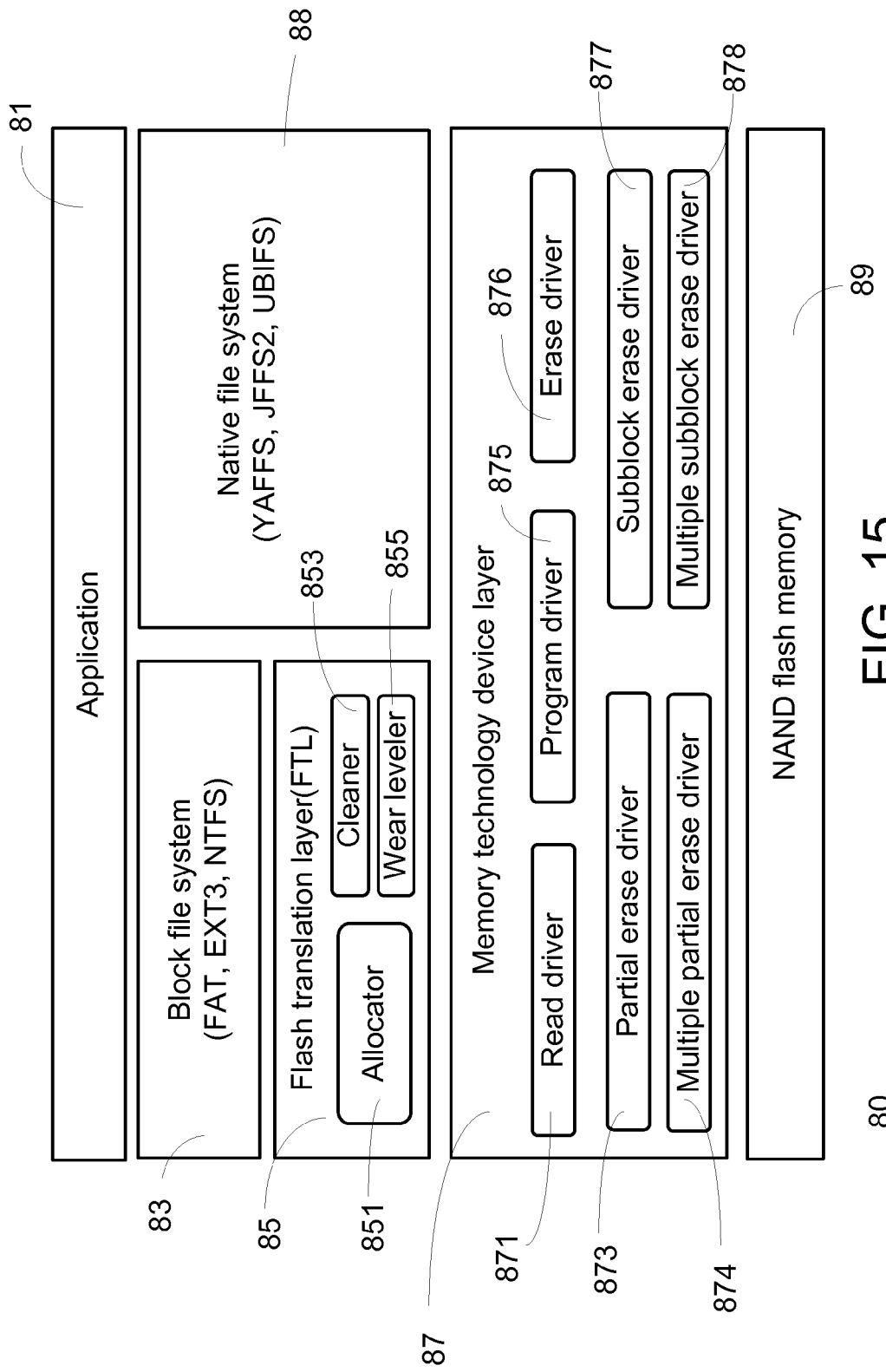
FIG. 15 schematically illustrates the architecture of a data processing system for implementing the erase method of the present invention.

FIG. 15 schematically illustrates the architecture of a data processing system for implementing the erase method of the present invention. The erase method of the present invention can be realized in the firmware and software level. By executing an application program 81, the data processing system 80 may store, retrieve or update the data that are stored in a NAND flash memory 89.

A memory technology device (MTD) layer 87 is an interface for a flash translation layer 85 and a native file system 88 to access the NAND flash memory 89. The data processing system 80 further includes a flash translation layer (FTL) 85, which is severed as an interface between the block file system 83 and the memory technology device layer 87. The flash translation layer 85 includes an allocator 851, a cleaner 853 and a wear leveler 855.

The block file system 83, the flash translation layer 85 and the memory technology device 87 utilize flash memory as a storage media. An example of the block file system 83 includes but is not limited to a file allocation table (FAT), a third extended file system (EXT3) or a new technology file system (NTFS).

The data processing system 80 further includes a native file system 88, which is a flash memory based storage system. An example of the native file system 88 includes but is not limited to a journaling flash file system version 2 (JFFS2), an unsorted block image file system (UBIFS) or a yet another flash file system (YAFFS).

The memory technology device layer 87 includes a read driver 871, a partial erase driver 873, a multiple partial erase driver 874, a program driver 875, an erase driver 876, a subblock erase driver 877 or a multiple subblock erase driver 878.

The technology of the present invention may be applied to a secure digital memory card (SD card), a solid state drive (SSD), an embedded multi-media card (eMMC) or any other appropriate storage system which places FTL and MTD on the firmware. The erase method of the present invention can be realized on the firmware without modifying the design and management of the file system at the higher levels.

Moreover, the technology of the present invention may be realized on the FLT 85 or the native file system 88 in order to control the block management. The memory technology device 87 should include corresponding drivers to support the proposed commands such as partial erase commands, multiple partial erase commands, subblock erase commands and multiple subblock erase commands. The technology of the present invention can be applied to the common designs of the flash translation layer such as a block level mapping layer (BL), a block associative sector translation layer (BAST) or a fully associative sector translation layer (FAST).

For storing charges, the flash memory of the present invention may include a floating gate made of electrically conductive material and use a floating gate-based or a silicon-oxide-nitride-oxide-silicon (SONOS) based charge trapping configuration. By the SONOS-based charge trapping configuration, the charges cannot be easily moved between the oxide-nitride-oxide (ONO) layers, and the charges can be trapped at the fixed locations. As known, the charges are moved between the ONO layers at a slow rate. Consequently, it takes a long time for the flash memory in the SONOS configuration to perform the erase operation. In case that the erase method of the present invention is applied to the flash memory in the SONOS configuration, the efficacy is more noticeable.

In the above embodiments, the threshold voltage distribution of the flash memory is illustrated by referring to the single-level cell (SLC) flash memory. It is noted that the flash memory of the present invention may be a multi-level cell (MLC) flash memory or a triple-level cell (TLC) flash memory. Moreover, in case that the memory chip is implemented by NAND or NOR, the erase time period is too long. Consequently, the pipeline erase method of the present invention may be applied to various memory devices that need to be erased.

From the above descriptions, the present invention provides an erase method for performing pipeline erase operations on the blocks. The erase method of the present invention is capable of generating the free blocks at a higher rate. Moreover, since the time period of erasing the block is shortened, the possibility of erroneously judging the flash memory as the malfunctioned flash memory by the control chip will be decreased. Moreover, the erase method of the present invention can simultaneously perform partial erase operations or subblock erase operations on blocks in plural pipeline stages according to multiple partial erase commands or multiple subblock erase commands.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erase method for a memory device with a plurality of blocks, the erase method comprising steps of:
sequentially performing a first stage erase operation and a second stage erase operation on at least one first block of the plurality of blocks in a first time interval and a second time interval; and sequentially performing the first stage erase operation and the second stage erase operation on at least one second block of the plurality of blocks in the second time interval and a third time interval, wherein in the second time interval, the first stage erase operation performed on the at least one second block and the second stage erase operation performed on the at least one first block are different.

2. The erase method as claimed in claim 1, wherein the first time interval, the second time interval and the third time interval are equal.

3. The erase method as claimed in claim 1,
wherein after the first stage erase operation is performed, a first threshold voltage corresponding to the at least one first block and a second threshold voltage corresponding to the at least one second block are reduced from an original level to a first level,
wherein after the second stage erase operation is performed, the first threshold voltage and the second threshold voltage are reduced from the first level to a second level.

4. The erase method as claimed in claim 1, wherein the at least one first block contains a plurality of first pages, wherein at least a first one of the plurality of first pages is erased in the first time interval, and at least a second one of the plurality of first pages is erased in the second time interval.

5. The erase method as claimed in claim 4, wherein the at least one second block contains a plurality of second pages, wherein at least a first one of the plurality of second pages is erased in the second time interval, and at least a second one of the plurality of second pages is erased in the third time interval.

6. The erase method as claimed in claim 1, wherein a number of the at least one first block and a number of the at least one second block are equal.

7. The erase method as claimed in claim 1, wherein each of the plurality of blocks is completely erased after M intervals.

8. The erase method as claimed in claim 1, wherein the at least one first block and the at least one second block are selected from the plurality of blocks according to a selection algorithm.

9. The erase method as claimed in claim 1, wherein the memory device comprises a first memory chip, wherein the at least one block and the at least one second block are included in the first memory chip.

10. The erase method as claimed in claim 1, wherein the memory device comprises a plurality of memory chips, wherein the at least one block and the at least one second block are included in different memory chips.

11. A memory device, comprising:
a plurality of blocks; and
a controller electrically connected with the plurality of blocks, wherein the controller sequentially performs a first stage erase operation and a second stage erase operation on at least one first block of the plurality of blocks in a first time interval and a second time interval, wherein the controller sequentially performs the first stage erase operation and the second stage erase operation on at least one second block of the plurality of blocks in the second time interval and a third time interval, wherein in the second time interval, the first stage erase operation performed on the at least one second block and the second stage erase operation performed on the at least one first block are different.

12. The memory device as claimed in claim 11, wherein the first time interval, the second time interval and the third time interval are equal.

13. The memory device as claimed in claim 11, wherein after the first stage erase operation is performed, a first threshold voltage corresponding to the at least one first block and a second threshold voltage corresponding to the at least one second block are reduced from an original level to a first level by the controller, wherein after the second stage erase operation is performed, the first threshold voltage and the second threshold voltage are reduced from the first level to a second level by the controller.

14. The memory device as claimed in claim 11, wherein the at least one first block contains a plurality of first pages, wherein at least a first one of the plurality of first pages is erased in the first time interval, and at least a second one of the plurality of first pages is erased in the second time interval.

15. The memory device as claimed in claim 14, wherein the at least one second block contains a plurality of second pages, wherein at least a first one of the plurality of second pages is erased in the second time interval, and at least a second one of the plurality of second pages is erased in the third time interval.

16. The memory device as claimed in claim 11, wherein a number of the at least one first block and a number of the at least one second block are equal.

17. The memory device as claimed in claim 11, wherein each of the plurality of blocks is completely erased after M intervals.

18. The memory device as claimed in claim 11, wherein the at least one first block and the at least one second block are selected from the plurality of blocks according to a selection algorithm.

19. The memory device as claimed in claim 11, wherein the memory device further comprises a first memory chip, wherein the at least one block and the at least one second block are included in the first memory chip.

20. The memory device as claimed in claim 11, wherein the memory device further comprises a plurality of memory chips, wherein the at least one block and the at least one second block are included in different memory chips.

* * * * *